United States Patent [19]

Nguyen et al.

[11] Patent Number: 6,084,279
[45] Date of Patent: Jul. 4, 2000

[54] SEMICONDUCTOR DEVICE HAVING A METAL CONTAINING LAYER OVERLYING A GATE DIELECTRIC

[75] Inventors: Bich-Yen Nguyen, Austin, Tex.; J. Olufemi Olowolafe, Bear, Del.; Bikas Maiti, Austin, Tex.; Olubunmi Adetutu, Austin, Tex.; Philip J. Tobin, Austin, Tex.

[73] Assignee: Motorola Inc., Schaumburg, Ill.

[21] Appl. No.: 08/831,287

[22] Filed: Mar. 31, 1997

[51] Int. Cl.$^7$ .................................................. H01L 21/338
[52] U.S. Cl. .......................................... 257/412; 257/768
[58] Field of Search .................................. 257/768, 769, 257/770, 763, 412

[56] References Cited

U.S. PATENT DOCUMENTS

| | | | |
|---|---|---|---|
| 4,490,209 | 12/1984 | Hartman | 156/643 |
| 4,605,947 | 8/1986 | Price et al. | 357/23.15 |
| 4,847,111 | 7/1989 | Chow et al. | 427/38 |
| 4,977,100 | 12/1990 | Shimura | 437/44 |
| 5,066,615 | 11/1991 | Brady et al. | 437/229 |
| 5,200,028 | 4/1993 | Tatsumi | 156/656 |
| 5,364,803 | 11/1994 | Lur et al. | 437/40 |
| 5,559,047 | 9/1996 | Urabe | 437/41 |
| 5,688,703 | 11/1997 | Klingbeil, Jr. et al. | 437/41 |

OTHER PUBLICATIONS

Campbell, et al.; "MOSFET Transistors Fabricated with High Permitivity TiO2 Dielectrics"; IEEE Transactions on Electron Devices; vol. 44, No. 1; pp. 104–109; Jan. 1997.
Akasaka, et al.; "Low–Resistivity Poly–Metal Gate Electrode Durable for High–Temperature Processing"; IEEE Transactions on Electron Devices; vol. 43, No. 11; pp. 1864–1868; (1996).
Hubbard, et al.; "Thermodynamic Stabiltiy of Binary Oxides in Contact with Silicon"; Mat. Res. Soc. Symp. Proc. vol. 401; pp. 33–39 (1996).
He, et al.; "Microstructure and properties of Ti–Si–N films prepared by plasma–enhanced chemical vapor deposition"; Materials Chemistry and Physics; 44; pp. 9–16 (1996).

Sun, et al."A Comparative Study of CVD Tin and CVD TaN Diffusion Barriers for Copper Interconnection"; IEEE 1995 Int'l Electron Devices Meeting Technical Digest; pp. 461–464 (1995).
Kasai, et al.;"W/WNx/Poly–Si Gate Technology for Future High Speed Deep Submicron CMOS LSIs"; IEDM; pp. 497–500 (1994).
Reid, et al.; "Evaluation of amorphous (Mo, Ta, W)–Si–N diffusion barriers for <Si>ICu metallizations; Thin Solid Films, vol. 236; pp. 319–24; (1993).
Wang, et al.; "Diffusion barrier study on TaSix and TaSixNy"; Thin Solid Films,; vol. 235; pp. 169–74 (1993).
Shizhi, et al.; "Ti–Si–N Films Prepared by Plasma–Enhanced Chemical Vapor Deposition"; Plasma Chemistry and Plasma Processing; vol. 12, No. 3; pp. 287–97 (1992).
Wright, et al.; "The Effect of Fluorine in Silicon Dioxide Gate Dielectrics"; IEEE Transactions of Electron Devices; vol. 36, No. 5; pp. 879–89 (1989).
Onodera, et al.; "A 630–mS/mm GaAs MESFET with Au/WSiN Refractory Metal Gate"; IEEE Electron Device Letters; vol. 9, No. 8; pp. 417–18 (1988).
Chiou, et al.; "Microstructure and Properties of Multilayer–Derived Tungsten Silicide"; Journal of Electronic Materials, vol. 16; No. 4; pp. 251–55 (1987).
Shah; "Refractory Metal Gate Processes for VLSI Applications"; IEEE Transactions on Electron Devices, vol. ED–26, No. 4; pp. 631–40 (19790.

Primary Examiner—Donald L. Monin, Jr.
Attorney, Agent, or Firm—Robert A. Rodriguez; George R. Meyer

[57] ABSTRACT

Metal semiconductor nitride gate electrodes (40, 70) are formed for use in a semiconductor device (60). The gate electrodes (40, 70) may be formed by sputter deposition, low pressure chemical vapor deposition (LPCVD), or plasma enhanced chemical vapor deposition (PECVD). The materials are expected to etch similar to silicon-containing compounds and may be etched in traditional halide-based etching chemistries. The metal semiconductor nitride gate electrodes (40, 70) are relatively stable, can be formed relatively thinner than traditional gate electrodes (40, 70) and work functions near the middle of the band gap for the material of the substrate (12).

21 Claims, 4 Drawing Sheets

SEMICONDUCTOR DEVICE HAVING A METAL CONTAINING LAYER OVERLYING A GATE DIELECTRIC

RELATED APPLICATIONS

This is related to the U.S. patent application Ser. Nos. 08/828,635; 08/828,638; 08/829,405; 08/829,752; and 08/831,286, all filed of even date and assigned to the current assignee hereof.

FIELD OF THE INVENTION

This invention relates in general to processes for forming semiconductor devices and more particularly to forming metal-insulator-semiconductor field-effect transistors with metal semiconductor nitride gate electrodes.

BACKGROUND OF THE INVENTION

In many very large scale integrated semiconductor (VLSI) devices, gate electrodes typically include a doped silicon film and a refractory metal silicide film. In some of these devices, the refractory metal silicide is tungsten silicide, which is typically formed by reacting tungsten hexafluoride ($WF_6$) with silane ($SiH_4$). One of the problems with tungsten hexafluoride is that the fluorine can cause gate dielectric thickening. The thickening changes the electrical characteristics of the gate dielectric and is undesired. After forming the tungsten silicide film, an anti-reflective coating (ARC) is formed over the tungsten silicide. Typically, this film includes silicon nitride or the like, but silicon nitride adheres poorly to tungsten silicide. Therefore, a thin undoped amorphous silicon film is used between the tungsten silicide and silicon nitride to promote adhesion.

Another problem with the prior art is typically two doping steps are used in forming the doped silicon film. More specifically, N+ doped silicon is used over n-channel transistors and P+ silicon is used over the p-channel transistors. A further problem with the prior art gate electrodes is that boron from the gate electrode can penetrate the substrate and change the threshold voltage of the p-channel transistors. This problem is more pronounced with a thin gate dielectric layer.

A need exists to form a gate electrode that has a work function near the middle of the band gap for the material of the substrate, does not cause the fluorine-related problems of gate thickening, and is resistant to boron penetration. A need also exists for forming the gate electrodes without using a complicated process or by having to use marginal processing steps.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures are exaggerated relative to other elements to help to improve understanding of embodiment(s) of the present invention.

DETAILED DESCRIPTION

Metal semiconductor nitride gate electrodes are formed for use in a semiconductor device. The gate electrodes are formed by sputter deposition, low pressure chemical vapor deposition (LPCVD) or plasma enhanced chemical vapor deposition (PECVD). The materials are expected to etch similar to silicon-containing compounds and are etched in traditional halide-based etching chemistries. One advantage of the metal semiconductor nitride gate electrodes is that they are relatively stable, can be formed relatively thinner than traditional gate electrodes, and have work functions near the middle of the band gap for the material of the substrate.

Figure 1:
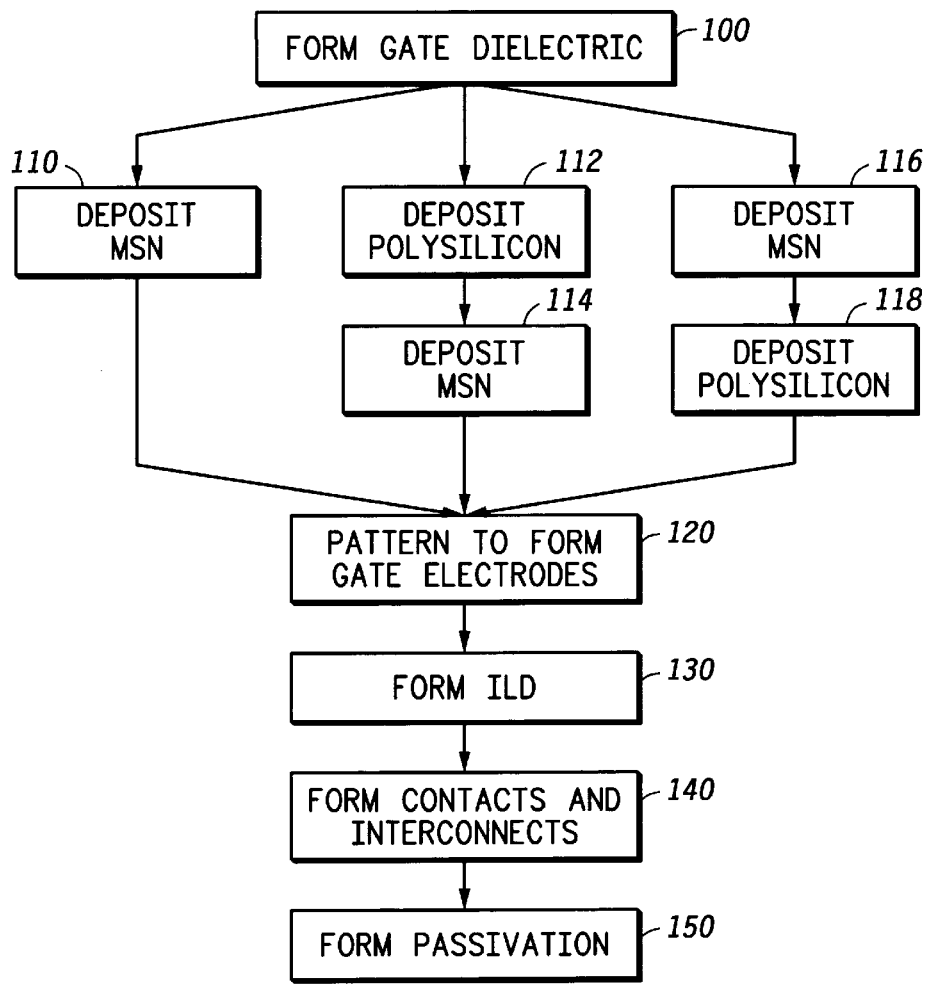
FIG. 1 includes a process flow diagram for forming a semiconductor device in accordance with one embodiment of the present invention.

FIG. 1 includes a process flow diagram for forming a semiconductor device that includes a metal semiconductor nitride (MSN) gate electrode. A gate dielectric layer is formed over a semiconductor device substrate in step 100. As used in this specification a semiconductor device substrate includes a monocrystalline semiconductor wafer, a semiconductor-on-insulator wafer, or any other substrate used to form semiconductor devices.

After forming the gate dielectric layer, a metal semiconductor nitride film and, optionally, a doped amorphous silicon or doped polycrystalline silicon (polysilicon) film are formed over the gate dielectric layer. Referring to FIG. 1, this is illustrated as step 110 or a combination of steps 112 and 114, or yet another combination of steps 116 and 118. Referring to step 110, one or more films of a metal semiconductor nitride are deposited over the gate dielectric layer. In steps 112 and 114, a doped polysilicon film is first deposited over the gate dielectric layer and then a metal semiconductor nitride film is deposited over the doped polysilicon layer. In steps 116 and 118, a metal semiconductor nitride film is deposited over the gate dielectric layer, and then a doped polysilicon film is deposited over the metal semiconductor nitride film. After forming the appropriate films, they are patterned to form gate electrodes in step 120.

Following the formation of gate electrodes, an interlevel dielectric layer (ILD) is formed in step 130. Contacts and interconnects are formed to the appropriate locations of the semiconductor device in step 140. A passivation layer is formed over the uppermost level of interconnects in step 150.

Figure 2:
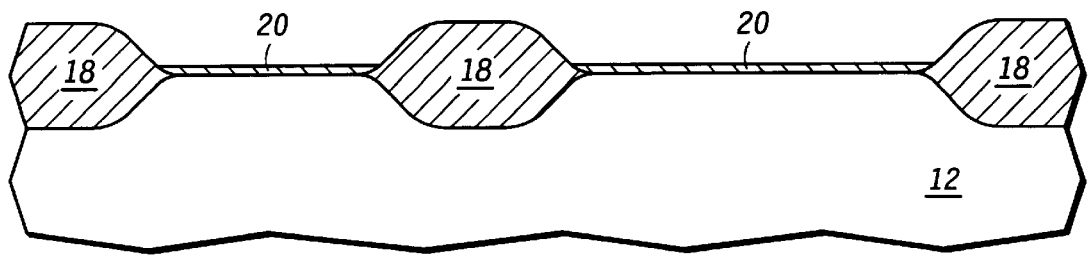
FIG. 2 includes an illustration of a cross sectional view of a portion of a semiconductor device substrate after forming field isolation regions and a gate dielectric layer.

The process flow will now be discussed in more detail with the formation of the device as illustrated in FIGS. 2–5. FIG. 2 includes the semiconductor device substrate 12 that is lightly p-typed doped silicon. Field isolation regions 18, which include an insulating layer, are formed using a selective oxidation process or a shallow trench isolation process. Subsequently, a thin gate dielectric layer 20 is formed over the substrate. The gate dielectric layer 20 includes silicon dioxide, a nitrided oxide, or silicon nitride. The gate dielectric layer 20 typically has a thickness in a range of approximately 15–150 angstroms. The gate dielectric layer 20 is formed using a thermal oxidation step, by depositing a layer, or by a combination of thermal oxidation and chemical vapor deposition.

Figure 3:
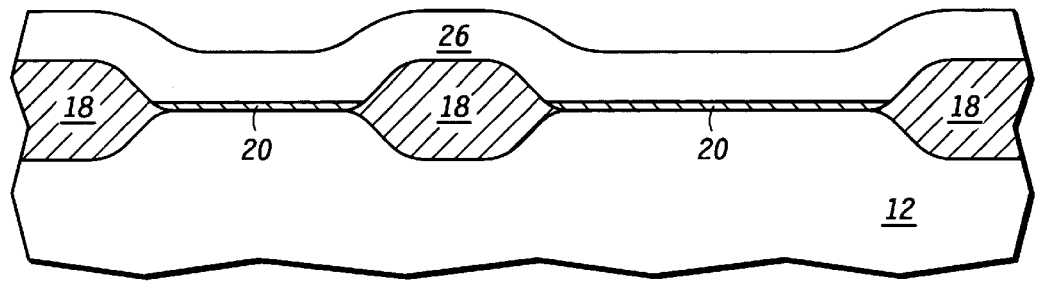
FIG. 3 includes an illustration of a cross sectional view of the substrate of FIG. 2 after forming a metal semiconductor nitride film.

A metal semiconductor nitride film 26 is deposited over the field isolation regions 18 and the gate dielectric layer 20 as illustrated in FIG. 3. The metal semiconductor nitride film 26 has a thickness in a range of approximately 200–1000 angstrom and is more usually 400–600 angstroms. Metal semiconductor nitride film 26 has a metal that includes titanium, vanadium, chromium, zirconium, hafnium, niobium, molybdenum, tantalum, tungsten, cobalt, platinum, nickel, iridium, osmium, rhenium, or the like.

The material can be deposited by sputter deposition (physical vapor deposition). In one embodiment, a target with the metal semiconductor nitride is prepared and sputtered using an argon plasma. In another embodiment, reactive sputtering is used by directing a plasma including nitrogen and argon at a target including a metal silicide. The nitrogen reacts with the metal suicide to form a metal semiconductor nitride film.

In still other embodiments, low pressure chemical vapor deposition (non-plasma assisted) is used. The metal source can include a metal halide, such as tungsten hexafluoride ($WF_6$), titanium tetrachloride ($TiCl_4$), tantalum pentachloride ($TaCl_5$), and the like. In addition, metal organic chemical vapor deposition could be used. The metal precursor can be one of many different types, as long as, the compound can be vaporized at the deposition parameters. In the example of tantalum silicon nitride, the metal precursor includes ethyltrikis diethylamido tantalum, tertbutylimido trisdimethylamino tantalum, pentadimethylamido tantalum, or the like. Clearly, these are just a few examples. The chemical vapor deposition also has a semiconductor source gas that includes silane ($SiH_4$), disilane ($Si_2H_6$), dichlorosilane ($SiH_2Cl_2$), germane ($GeH_4$), or the like and a nitrogen source gas that includes ammonia ($NH_3$), molecular nitrogen ($N_2$), or the like. The film could also be formed using plasma enhanced chemical vapor deposition (PECVD). By using PECVD, more control over the stress of the metal semiconductor nitride film can be exercised if stress is an issue.

Figure 4:
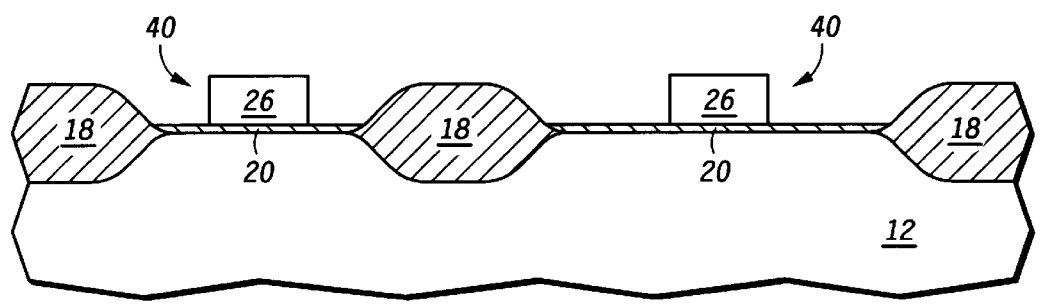
FIG. 4 includes an illustration of a cross sectional view of the substrate of FIG. 3 after patterning the metal semiconductor nitride film to form gate electrodes in accordance with one embodiment of the present invention.

A resist layer (not shown) is then coated over the metal semiconductor nitride film 26 and patterned. After patterning the resist layer, the metal semiconductor nitride film 26 is patterned to form gate electrodes 40 as illustrated in FIG. 4. When forming the gate electrodes 40, the etching chemistry is typically similar to that used for etching polysilicon. Typically, halogen-based chemistries are used to etch film 26 and include carbon tetrafluoride ($CF_4$), hexafluoroethane ($C_2F_6$), hydrogen bromide (HBr), sulfur hexafluoride ($SF_6$), hydrogen chloride (HCl), molecular chlorine ($Cl_2$), or the like.

Plasma etching, reactive ion etching, electron cyclotron resonance, or microwave can be used for patterning. A downstream plasma may be used to decrease the amount of damage to the gate dielectric layer 20 that underlies the metal semiconductor nitride film 26. Typically, the etch is performed using endpoint detection when the field isolation regions 18 or gate dielectric layer 20 is reached followed by a timed overetch. After the gate electrodes 40 have been formed, the resist layer is removed using conventional methods.

Figure 5:
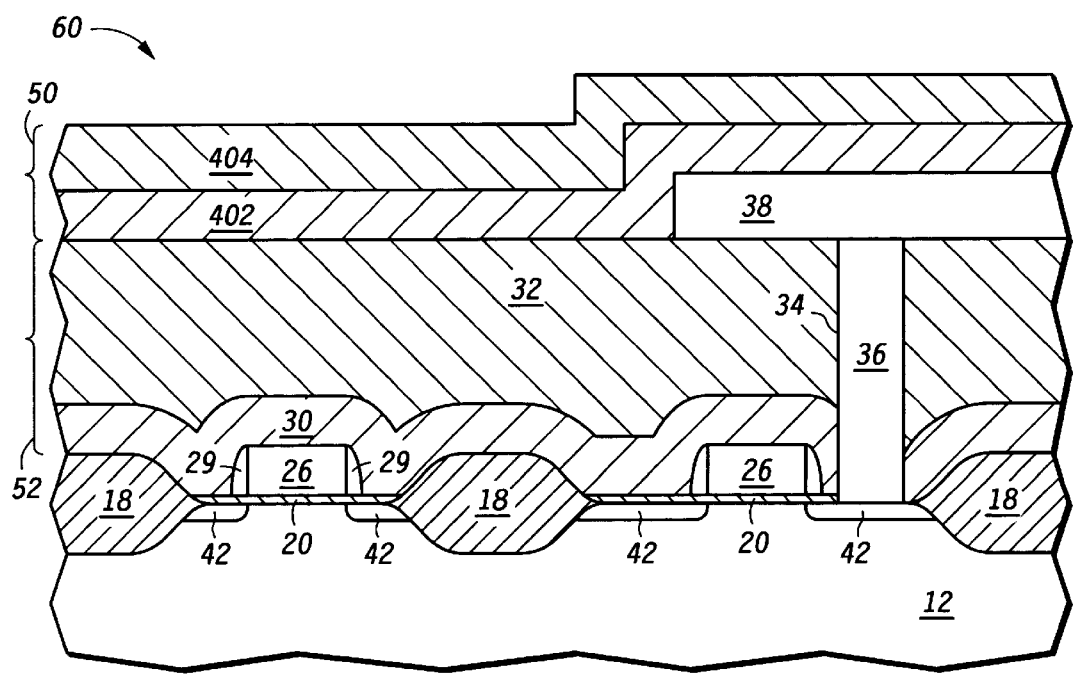
FIG. 5 includes an illustration of a cross sectional view of the substrate of FIG. 4 after forming a substantially completed device.

Processing continues to form a substantially completed semiconductor device 60 that includes metal-insulator-semiconductor transistors as is illustrated in FIG. 5. After forming the gate electrodes 40, doped regions 42 are formed within the substrate 12 adjacent to the gate electrodes 40. The doped regions are source/drain regions (current electrodes) for the transistors shown. Insulating spacers 29 are also formed adjacent to the gate electrodes 40. An interlevel (ILD) dielectric layer 52 is formed that includes an undoped oxide film 30 and a doped oxide film 32. The doped oxide film 34 includes borophosphosilicate glass (BPSG). The ILD layer 52 is then patterned to form contact opening 34 to one or more of the doped regions 42.

A conductive plug 36 is formed within the contact opening 34 and an interconnect 38 is formed over the conductive plug 36. Note that other conductive plugs, contact openings, and interconnects are formed but are not illustrated in FIG. 5. Additionally, other interlevel dielectric layers and interconnect levels can be formed over ILD layer 52 and interconnect 38 but are not illustrated in FIG. 5. Over the uppermost interconnect level, a passivation layer 50 is formed and includes a doped oxide film 402 and a plasma enhanced nitride film 404.

The gate electrodes 40 are much thinner than the gate stacks used in the prior art that include polysilicon, a refractory metal silicide, an amorphous silicon film and a silicon nitride film. In those prior art structures, the gate stack can exceed 0.5 microns in height because many films are used. Unlike the prior art, the metal semiconductor nitride film does not required a separate anti-reflective coating (ARC). Also, there is less process and complexity with this embodiment because only one film is deposited for the gate electrode compared to the prior art that have three or more separate films formed. This helps increase the speed of the device.

Another advantage of the present invention over the prior art is that it allows the gate electrode to be scaled down without causing an exponential increase in the resistance of the gate electrodes. More specifically, titanium silicide ($TiSi_2$) can agglomerate or have other problems with high resistance as the gate is scaled below 0.25 micron. Although TiSiN resistance will increase as it is scaled down, it should not increase as quickly as $TiSi_2$ when scaled below 0.25 micron. Therefore, one advantage of the present invention is that it scales with the technology better than the prior art.

The present invention also has advantages over gate electrodes that include gold because problems associated with temperature stability during routine processing of a field-effect transistor are expected. The gold can diffuse into and interact with the metal semiconductor nitride film. These temperature cycles can occur during an N+ source/drain anneal that typically is performed at a temperature of at least 800 degrees Celsius, an emitter drive from a doped polysilicon feature performed at a temperature in the range of 1000 to 1100 degrees Celsius, and other thermal cycles greater than 500 degrees Celsius.

Additionally, gold can contaminate the substrate and cause electrical shorts that are undesired. Therefore, by forming the metal semiconductor nitride film without having any gold, many of the problems related to temperature stability and gold contamination are eliminated.

The metal semiconductor nitride gate electrodes have advantages over the prior art in other ways. The gate electrodes can be formed such that they have a work function near the middle of the band gap for the material in substrate 12. If the substrate 12 is silicon, the work function of the gate electrodes may be within 0.2 electron volts of the middle of the silicon band gap. The prior art problems with fluorine penetration should be greatly reduced because a metal semiconductor nitride film is being formed and should be an effective barrier for both fluorine and boron. Additionally, a silicon nitride film is not required for an ARC, and therefore, the adhesion problem seen in the prior art are eliminated.

In the present invention as illustrated in FIG. 5, the structure shown may be part of a static random access memory. In that case, the interconnect 38 would be a bit line with conductive plug 36 being a bit line contact to doped region 42. The gate electrode 40 adjacent to the bit line contact would be an access transistor for a static random access memory (SRAM) cell, and the other gate electrode 26 is a gate electrode for a latch transistor. In still another embodiment, the gate electrodes are used in a dynamic random access memory. The structure would be similar except that there would not be any latch transistors, however, there would still be an access transistor with a bit line contact. In the case of access transistors, a gate electrode 40 may be part of a word line for the memory array.

Figure 6:
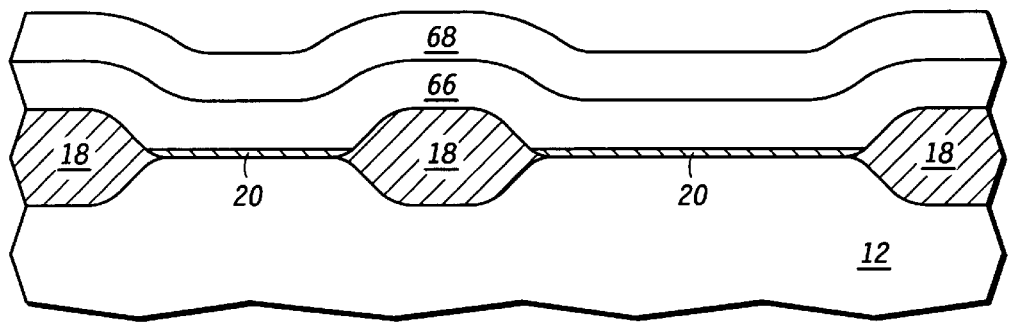
FIGS. 6–11 include illustrations of cross-sectional views of other embodiments for forming the gate electrodes in accordance with the present invention.

In an alternate embodiment, a bilayered gate electrode 35 is formed. Referring to FIG. 6, a metal semiconductor nitride film 66 is deposited over the field isolation regions 18 and gate dielectric layer 20. A doped silicon film 68 is then formed over the metal semiconductor nitride film 66. The doped silicon film 68 includes deposited amorphous silicon or polysilicon and is doped either insitu or during a separate doping step. In this particular embodiment, the thickness of the bilayer should be in range of approximately 1000–2000 angstroms thick. However, the metal semiconductor nitride film 66 should remain approximately 200–1000 angstroms thick. The doped silicon film 68 helps reduce the amount of stress in the stack. Optionally, an ARC can be formed over the polysilicon film but is not shown in FIG. 6.

Figure 7:
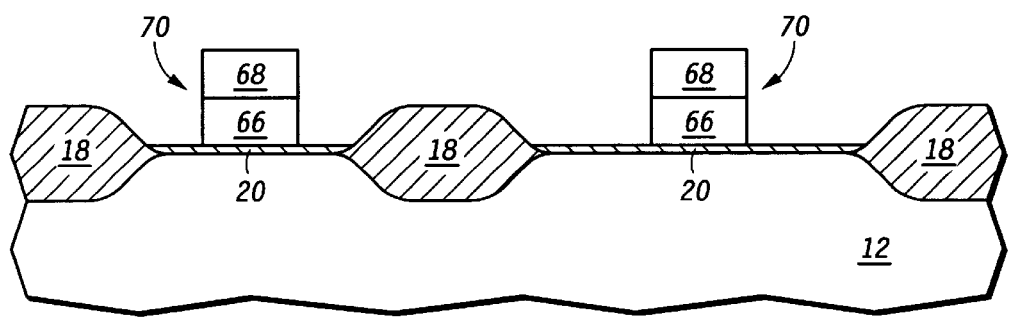

A resist layer (not shown) is coated over the doped silicon film 68, and the two films are then patterned to form gate electrodes 70 as illustrated in FIG. 7. The resist layer is then removed using conventional methods. Again, similar etching chemistries are used that are used to etch the metal semiconductor nitride film 66 and doped silicon film 68. One advantage with this process is that the endpoint detection can be tuned to the metal in the metal semiconductor nitride film 66. For example, if a tungsten silicon nitride film is being etched, the plasma etcher would monitor the tungsten in the effluent gas. When the tungsten essentially goes to zero or gets below a threshold value, the endpoint has been reached.

Figure 8:
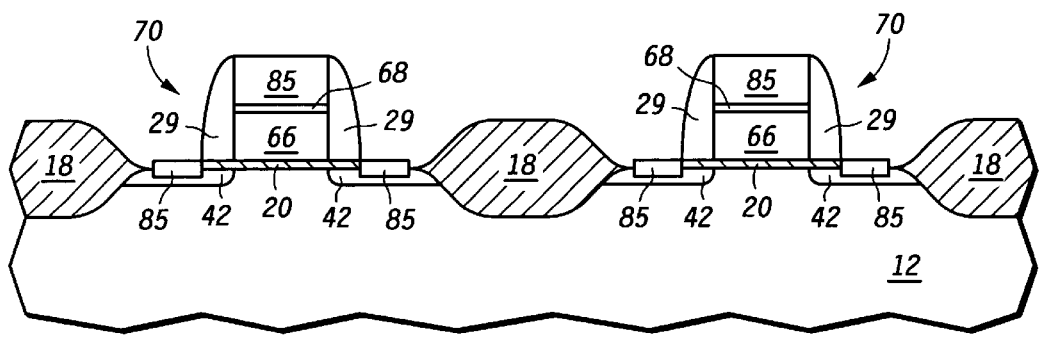

Processing continues to form the rest of the metal-insulator-semiconductor transistors as illustrated in FIG. 8.

Doped regions 42 are formed within the substrate 12 at the primary surface of the substrate 12 and adjacent to the gate electrodes 70. These doped regions 42 will be n-type or p-type depending upon whether n-channel or p-channel transistors are to be formed. The doped regions 42 are source/drain regions (current electrodes) for the transistors. Sidewall spacers 29 are then formed adjacent to the gate electrodes 70. The portions of the gate dielectric layer 20 that are not covered by the gate electrodes 70 or sidewall spacers 29 are then removed.

A silicide process is then performed to form self-aligned metal silicide regions 85 over portions of the doped regions 42 and silicon film 68. In this particular embodiment, a titanium layer is deposited and reacted with exposed silicon to form the silicide regions 85. Most of the silicon film 68 has been consumed during the silicide formation. In other embodiments, all the silicon film 68 or only a smaller portion thereof is consumed during the silicide reaction.

In still another embodiment, the films as illustrated in FIGS. 6 and 7 can be reversed. In this instance the doped silicon film 68 is formed on the field isolation regions 18 and the gate dielectric layer 20, and the metal semiconductor nitride film 66 is deposited over the doped silicon film 68. The thickness and the etching of this film should be the same as the prior embodiment. However, unlike the previous embodiment the doping of the silicon film 68 depends on what type of devices are being formed. More specifically, if the gate electrodes will be for n-channel transistors, the doped silicon is n-typed doped and for p-channel transistors it will be p-typed doped. An advantage of this embodiment over the prior one is that an ARC is not required. Further, there is a lesser likelihood of plasma damage to the gate dielectric layer 20. Either bilayered embodiment should have lower resistance compared to prior art gate electrodes using metal suicides or metal nitrides.

Figure 9:
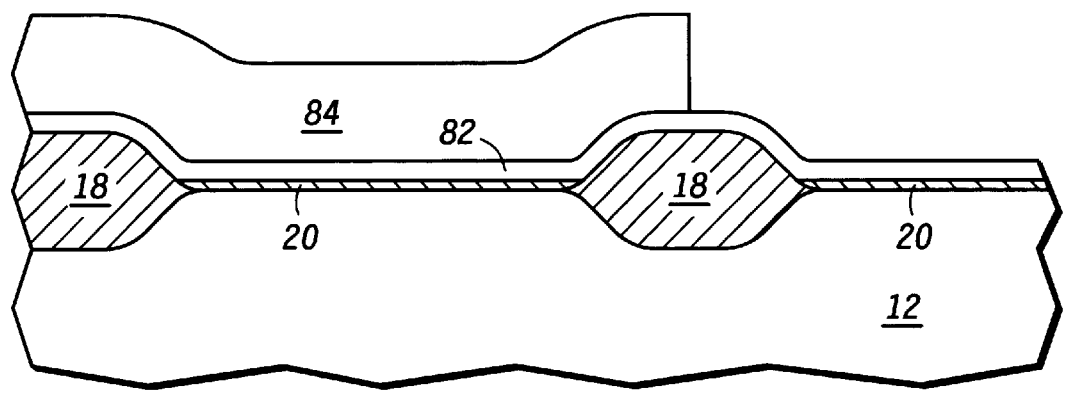
Figure 10:
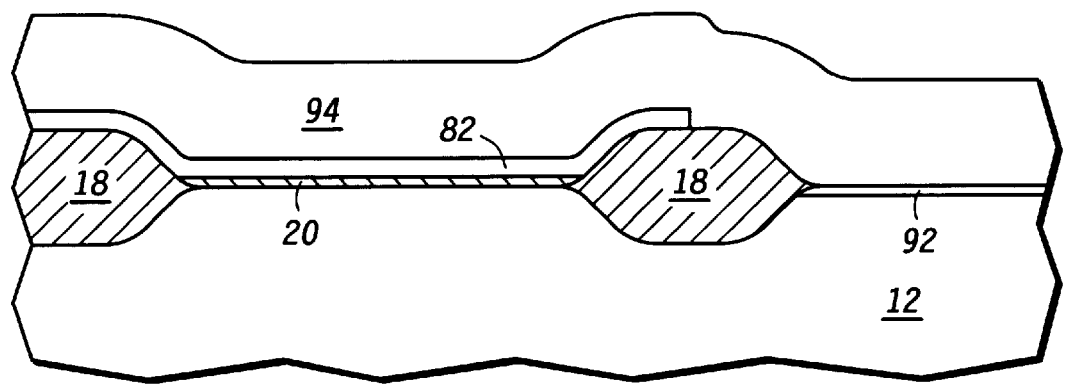
Figure 11:
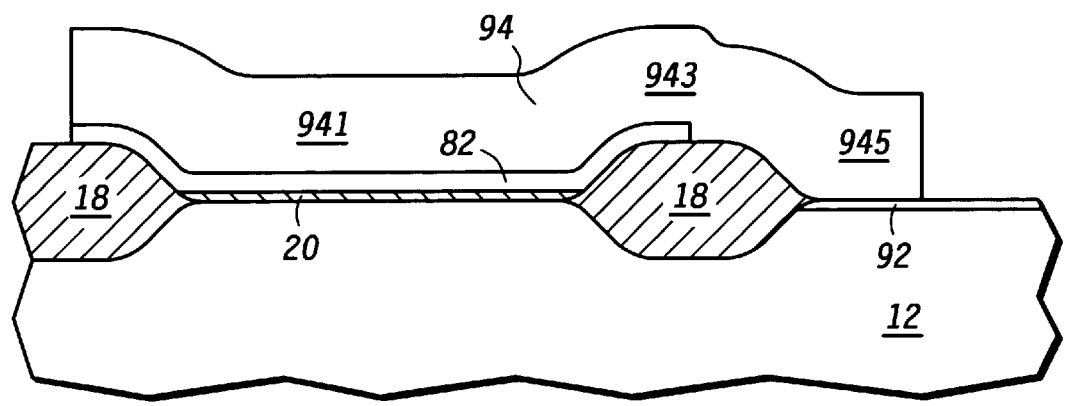

FIGS. 9–11 include another embodiment of the present invention illustrating a gate electrode and substrate contact. Referring to FIG. 9, a first metal semiconductor nitride film 82 is formed over the field isolation regions 18 and gate dielectric layer 20. The metal semiconductor nitride film 82 typically has a thickness in range of approximately 200–500 angstroms. A resist mask 84 is then formed over portions of the metal semiconductor nitride film 82. In areas where the metal semiconductor nitride film 82 is exposed, a contact to the underlying substrate 12 will be formed. An etching step is performed to remove the metal semiconductor nitride film 82 and gate dielectric layer 20 that are not covered by the mask 84. A doping step is performed to create doped region 92 in the substrate 12 as seen in FIG. 10.

In the prior art, buried contacts are typically formed by using a polysilicon film that contacts a silicon substrate. The difficulty arises when etching the polysilicon without trenching the silicon substrate. By etching the metal semiconductor nitride film 82 and monitoring the metal content in the effluent stream, the control of the endpoint is much tighter and the likelihood of trenching of the substrate 12 should be greatly reduced compared to buried contacts that use an amorphous silicon or polysilicon film in direct contact with the substrate 12.

After the resist mask 84 is removed, a second metal semiconductor nitride film 94 is formed and typically has a thickness and range of approximately 500–1000 angstroms thick. The first metal semiconductor nitride film 82 and the second metal semiconductor nitride film 94 can be formed by the same or different deposition techniques and can also have the same metal or different metals within those films. The metal semiconductor nitride film 94 is deposited onto the first metal semiconductor nitride film 82 and a doped region 92 that lies within the substrate 12.

A resist layer (not shown) is then applied over the substrate and patterned. The first and second metal semiconductor nitride films 82 and 94 are etched to form a conductive member as shown in FIG. 11. The metal semiconductor nitride film 94 includes a gate electrode portion 941, a local interconnect portion 943, and a substrate contact portion 945. In this embodiment, the doped region 92 is part of one component, and the transistor that includes the gate electrode portion 941 is part of a different component. In this manner, a simple local interconnect with a substrate contact is formed having very small dimensions and without having to use conductive plugs or aluminum or copper interconnects.

Although many different metals for the metal semiconductor nitride film may be used, molybdenum, tantalum, tungsten, and titanium are expected to be used more than other metals. Of these metals, tantalum appears to be the most promising because of its low resistivity and its resistance to crystallization. Therefore, thinner gate electrodes can be formed that are more likely to be formed and remain amorphous.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. In the claims, means-plus-function clause(s), if any, cover the structures described herein that perform the recited function(s). The mean-plus-function clause(s) also cover structural equivalents and equivalent structures that perform the recited function(s).

We claim:

1. A semiconductor device comprising:

a substrate;

a gate dielectric layer adjacent the substrate;

a conductive member including a gate electrode adjacent the gate dielectric layer, wherein the conductive member includes a metal semiconductor nitride film, and wherein the metal semiconductor nitride film makes direct contact to the gate dielectric layer; and current electrode regions adjacent the gate electrode and the gate dielectric layer, wherein the semiconductor device includes the gate dielectric film, gate electrode, and current electrode regions.

2. The semiconductor device of claim 1, wherein the metal semiconductor nitride film has a thickness in a range of approximately 200–1000 angstroms.

3. The semiconductor device of claim 1, wherein the conductive member further includes a doped silicon film.

4. The semiconductor device of claim 1, wherein the conductive member includes a substrate contact portion, wherein the metal semiconductor nitride film makes direct contact to a surface of the substrate.

5. The semiconductor device of claim 1, wherein the conductive member includes a word line for a random access memory.

6. The semiconductor device of claim 1, wherein the gate electrode is a gate electrode for a latch transistor of a static random access memory cell.

7. The semiconductor device of claim 1, wherein the metal semiconductor nitride film comprises a metal selected from a group consisting of molybdenum, tantalum, tungsten, and titanium.

8. A semiconductor device comprising:

a substrate;

a gate dielectric layer adjacent the substrate;

a conductive member including a gate electrode at the gate dielectric layer, wherein the conductive member includes a metal semiconductor nitride film, and wherein the metal semiconductor nitride film makes direct contact to a surface of the substrate;

current electrode regions adjacent the gate electrode and the gate dielectric layer, wherein the semiconductor device includes the gate dielectric layer, gate electrode, and current electrode regions.

9. The semiconductor device of claim 8, wherein the metal semiconductor nitride film has a thickness of at least approximately two hundred angstroms.

10. The semiconductor device of claim 8, wherein the conductive member further includes a doped silicon film.

11. The semiconductor device of claim 8, wherein the conductive member includes a word line for a random access memory.

12. The semiconductor device of claim 8, wherein the gate electrode is a gate electrode for a latch transistor of a static random access memory cell.

13. The semiconductor device of claim 8, wherein the metal semiconductor nitride film comprises a metal selected from a group consisting of molybdenum, tantalum, tungsten, and titanium.

14. A semiconductor device comprising:

a substrate;

a field isolation region overlying the substrate;

a doped region adjacent the field isolation region; and a conductive member including a first metal semiconductor nitride film that contacts the doped region and overlies a portion of the field isolation region.

15. The semiconductor device of claim 14, wherein the first metal semiconductor nitride film has a thickness in a range of approximately 500–1000 angstroms.

16. The semiconductor device of claim 14, wherein the conductive member further includes a doped silicon film.

17. The semiconductor device of claim 14, wherein the first metal semiconductor nitride film comprises a metal selected from a group consisting of molybdenum, tantalum, tungsten, and titanium.

18. The semiconductor device of claim 14, where the conductive member includes an interconnect portion that locally interconnects two different components within the semiconductor device.

19. The semiconductor device of claim 14 further comprising:

a gate dielectric layer; and a second metal semiconductor nitride film underneath the first metal semiconductor nitride film, wherein the second metal semiconductor nitride film overlies a portion of the gate dielectric layer and is electrically coupled to the first metal semiconductor nitride film.

20. The semiconductor device of claim 14, wherein the second metal semiconductor nitride film has a thickness in a range of approximately 200–500 angstroms.

21. The semiconductor device of claim 14, wherein a metal of the second metal semiconductor nitride film is selected from a group consisting of molybdenum, tantalum, tungsten, and titanium.

* * * * *